United States Patent [19]

Hayakawa et al.

[11] Patent Number: 4,908,652

[45] Date of Patent: Mar. 13, 1990

[54] IMAGE RECORDING APPARATUS HAVING UPPER AND LOWER SECTIONS SEPARABLE FROM EACH OTHER AT MEDIUM EXPOSING PATH

[75] Inventors: Kiyoharu Hayakawa, Aichi; Yumio Matsumoto, Kasugai; Masashi Ueda, Nagoya; Akira Sago, Nagoya; Osamu Takagi, Nagoya, all of Japan

[73] Assignee: Brother Kogyo Kabushiki Kaisha, Aichi, Japan

[21] Appl. No.: 200,923

[22] Filed: Jun. 1, 1988

[30] Foreign Application Priority Data

| Jun. 8, 1987 | [JP] | Japan | 62-142553 |
| Jun. 9, 1987 | [JP] | Japan | 62-88971 |
| Jun. 10, 1987 | [JP] | Japan | 62-144536 |
| Jun. 10, 1987 | [JP] | Japan | 62-144598 |
| Jun. 10, 1987 | [JP] | Japan | 62-144539 |
| Jun. 10, 1987 | [JP] | Japan | 62-144540 |
| Jun. 10, 1987 | [JP] | Japan | 62-144535 |

[51] Int. Cl.$^4$ .................................. G03B 27/52
[52] U.S. Cl. .................................. 335/27; 355/133
[58] Field of Search .................. 355/27, 28, 100–103, 355/115, 113, 118, 133; 250/317.1–319

[56] References Cited

U.S. PATENT DOCUMENTS

| 3,604,801 | 6/1968 | Young | 355/133 X |
| 3,689,154 | 9/1972 | Swain et al. | 355/97 |

FOREIGN PATENT DOCUMENTS

| A30125497 | 12/1984 | European Pat. Off. |
| 416258 | 9/1934 | United Kingdom |
| 453738 | 9/1936 | United Kingdom |
| 2043927A | 10/1980 | United Kingdom |

Primary Examiner—L. T. Hix
Assistant Examiner—D. Rutledge
Attorney, Agent, or Firm—Oliff & Berridge

[57] ABSTRACT

An image recording apparatus includes a medium supporting device for supporting a roll of a photosensitive recording medium in the form of a web, such that an active length of the web supplied from the roll extends along an exposing path. The apparatus further includes an exposing device for imagewise exposing the active length of the web of the photosensitive recording medium to an image radiation representative of an original image to be reproduced, while the active length is placed in the exposing path. The apparatus has an upper section disposed above the exposing path and including the medium supporting device, and a lower section disposed below the exposing path and including the exposing device. The upper and lower sections are separable from each other at the exposing path.

18 Claims, 9 Drawing Sheets

IMAGE RECORDING APPARATUS HAVING UPPER AND LOWER SECTIONS SEPARABLE FROM EACH OTHER AT MEDIUM EXPOSING PATH

BACKGROUND OF THE INVENTION

1. Field of the Invention

The present invention relates generally to an image recording apparatus by using a photosensitive recording medium, and more particularly to such an image recording apparatus which has upper and lower sections that are separable from each other for easy handling of a recording medium.

2. Discussion of the Prior Art

Figure 11:
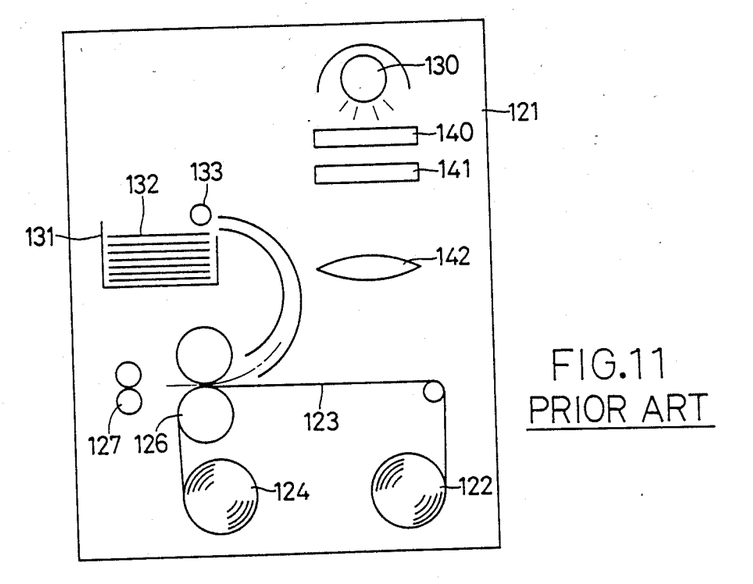
FIG. 11 is a schematic view showing a known image recording apparatus.

An example of an image recording apparatus is illustrated in FIG. 11, wherein a light source device 130 is disposed in an upper part of an upper section of the apparatus. Right below the light source device 130, there are disposed a color separation filter 140, and a transparent original 141 which bears an original image to be reproduced. The filter 140 has three filter elements corresponding to three primary colors of light, i.e., blue, green and red. Below the original 141 is a focusing lens 142 for focusing an image radiation transmitted through the original 141, on the surface of an active portion of a pressure-sensitive photosensitive web 123, which portion extends below the focusing lens 142. The photosensitive web 123 is supplied from a supply roll 122 which is accommodated in a suitable cassette mounted in a lower section of the apparatus. To the left of the supply roll 122 of the photosensitive web 123, there is disposed a take-up roll 124 on which a used length of the web 123 is wound. Above the take-up roll 124 is provided a developing device which includes a pair of presser rolls 126, and a pair of fixing rolls 127 which are located to the left of the presser rolls 126. Above the developing device is a sheet cassette 131 which stores a stack of developer sheets 132. Adjacent to an sheet outlet end of the sheet cassette 131 is provided a feed roller 133 for delivering the developer sheets 132 from the cassette 131.

In operation, the original 141 is irradiated by a radiation which is generated by the light source device 130 and which is transmitted through the color separation filter 140. The radiation which has passed the original 141 is focused by the focusing lens 142, on the surface of the active portion of the photosensitive web 123, whereby the active portion is imagewise exposed to the image radiation from the original 141, which represents the original image on the original 141. Thus, a latent image corresponding to the original image is formed on the photosensitive web 123. After the relevant portion of the web 123 is imagewise exposed, the developer sheet 132 is delivered from the sheet cassette 131, by the feed roller 133, and is superposed on the exposed length of the photosensitive web 123, before they are passed through a pressure nip between the presser rolls 126. With the passage of the exposed portion of the web 123 through the pressure nip of the presser rolls 126, together with the developer sheet 132, the latent image on the web 123 is developed into a visible image on the developer sheet 132. Then, the developer sheet 132 is passed through the nip of the fixing rolls 127, so that the visible image is fixed with enhanced color quality.

In the known image recording apparatus described above wherein the cassette for the photosensitive roll 122 is located in the lower section of the apparatus, it is considerably difficult to newly install or replace the roll 122. The installation or replacement of the cassette involves threading of the photosensitive web through the apparatus. To facilitate the installation or replacement of the photosensitive roll 122, it may be considered to divide the apparatus into upper and lower sections at an exposing path through which the photosensitive web 123 is fed, so that the upper and lower sections are separated from each other. However, a problem arises due to the location of the cassette for the photosensitive roll 122. Namely, the cassette occupies a substantial portion of the lower section of the apparatus, and therefore comparatively heavy devices and components should be disposed in the upper section of the apparatus. This may cause reduced installation and maintenance stability of the apparatus, particularly when the upper section is separated or removed from the lower base section.

SUMMARY OF THE INVENTION

It is therefore a first object of the present invention to provide an image recording apparatus which permits easy and safe installation and replacement of a roll of a photosensitive web.

The first object can be accomplished according to the principle of the present invention, which provides an image recording apparatus comprising a medium supporting device for supporting a roll of a photosensitive recording medium in the form of a web, such that an active length of the web supplied from the roll extends along an exposing path, the apparatus further comprising an exposing device for imagewise exposing the active length of the web of the photosensitive recording medium to an image radiation representative of an original image to be reproduced, while the active length is placed in the exposing path, the apparatus including an upper section which is disposed above the exposing path and which has the medium supporting device, and a lower section which is disposed below the exposing path and which has the exposing device. The upper and lower sections are adapted to be separable from each other at the exposing path. The two sections may be either partially or completely separable from each other, provided the separation in question makes the normally unaccessible exposing path accessible.

In the image recording apparatus of the present invention constructed as described above, the exposing path can be made accessible by separating the upper and lower sections from each other. Therefore, the roll of the photosensitive web can be easily installed or replaced with a new one, with reduced obstruction. Further, since the relatively large but light medium supporting device for supporting the photosensitive roll is disposed in the upper section of the apparatus, relatively heavy devices or components such as a drive motor may be positioned in the lower section, as well as the exposing device. Accordingly, the stability of the apparatus as a whole can be increased.

In one form of the instant recording apparatus, the upper and lower sections include as a main body an upper frame and a lower frame, respectively, and the upper frame is attached to the lower frame pivotally about an axis, so that the upper and lower sections being separable from each other at the exposing path, by a pivotal movement of the upper frame with respect to the lower frame. In this case, the upper and lower sections are not completely separated from each other, but the exposing path defined below the medium supporting device is easily accessible after the upper section is pivoted away from the lower section.

The apparatus may further comprise an upper cover which covers the medium supporting device and which is attached to the lower section such that the upper cover is pivotable relative to the upper frame in a direction away from the lower section, independently of the upper frame. Since the upper cover is pivotable relative to the pivotable upper frame, independently of each other, the leading portion of the photosensitive web can be easily threaded from the exposing path toward a take-up roll, which is usually disposed above or near the supply roll supported on the medium supporting device. Namely, a path leading to the take-up roll can be made accessible by pivoting the upper cover relative to the upper frame. For instance, fixing rolls for fixing a developed image may be displaced away from the path of the photosensitive web, by pivoting the upper cover away from the upper frame which supports the take-up roll. Preferably, the upper cover and the upper frame are pivoted in the same direction.

It is a second object of the present invention to provide such an image recording apparatus which permits easy threading of the photosensitive web through the developing device such as developing rolls.

The above object may be achieved according to one preferred arrangement of the above form of the invention, wherein the exposing device operates to form a latent image corresponding to the original image on the active length of the recording medium, by imagewise exposing the active length to the image radiation, and the lower section includes a pair of developing rolls which defines a pressure nip therebetween, the imagewise exposed length of the medium having the latent image being passed through the pressure nip, whereby the latent image is developed into a visible image. Further, the upper frame is supported pivotally about an axis of rotation of one of the pair of developing rolls. According to this arrangement, the upper frame supporting the roll of the photosensitive roll is pivoted about the developing device, more specifically, about the axis of rotation of one of the two developing rolls disposed in the lower section. Therefore, the leading portion of the photosensitive web can be easily threaded through the exposing path and through the nip of the developing rolls.

The second object may be attained according to another form of the present invention, wherein the upper frame supports a developing device for developing a latent image formed on the active length of the photosensitive web, into a visible image, by imagewise exposure thereto to the image radiation. In the present form of the apparatus, both the exposing path defined by the bottom surface of the medium supporting device, and the bottom portion of the developing device are accessible when the upper frame is pivoted with respect to the lower frame. Accordingly, the jammed web can be easily removed, and the apparatus can be readily inspected or repaired with the upper frame kept in the open position. Further, since the roll of the photosensitive web and the developing device are supported on the upper frame, the photosensitive web threaded through the apparatus will not be pulled by the developing device when the upper frame is pivoted relative to the lower frame, whereby otherwise possible damage and waste of the photosensitive web may be avoided, leading to a reduced running cost of the apparatus.

It is a third object of the present invention to provide an iamge recording apparatus wherein a latent image formed on a photosensitive web is developed into a visible image on a developer sheet, and which permits easy inspection and removal of a jamming trouble of the photosensitive web and the developer sheet.

The above object may be achieved according to a further form of the image recording apparatus of the present invention, which further comprises a developing mechanism and a feeding mechanism. The developing mechanism has developing rolls for pressing the imagewise exposed active length of the recording medium and a developer sheet superposed on the exposed active length toward each other, to thereby develop a latent image on the exposed active length into a visible image on the developer sheet. The feeding mechanism is adapted to feed the active length of the recording medium along the exposing path, and the developer sheet along a feed path. The present form of the apparatus is adapted such that the upper and lower sections are separable from each other at both of the exposing and feed paths. In the present case, both the exposing path for the photosensitive web and the feed path for the developer sheet are made accessible by separating the upper and lower sections of the apparatus from each other. Hence, the exposing and feed paths extending along or through the developing and feed mechanisms can be readily inspected for a jamming trouble of the photosensitive web and the developer sheet, and the jammed portion of the web or sheet can be easily removed from the apparatus.

It is a fourth object of the present invention to provide such an image recording apparatus as described just above, wherein the developing and feeding mechanisms can be easily manually operated during threading of the photosensitive web or removal of the jammed web or developer sheet.

The above object may be accomplished according to one preferred arrangement of the above form of the invention, wherein the lower section includes a drive device for driving the developing mechanism and the feeding mechanism, and the developing and feeding mechanisms are operatively disconnected from the drive device when the upper and lower sections are separated from each other, so that the developing and feeding mechanisms can be freely manipulated by the operator after the developing and feeding mechanisms are disconnected from the drive device. This arrangement permits automatic disconnection of the developing and feeding mechanisms from the drive device upon separation of the upper and lower sections, and thus allows easy threading of the photosensitive web, and easy removal of the jammed web or sheet, without operating any exclusive lever for disconnection of the developing and feeding mechanisms from the drive device. Certainly, the mechanisms are automatically operatively connected to the drive device when the upper and lower sections are returned to the normal operable position. Thus, the instant arrangement facilitates inspection and maintenance procedures and simplifies the construction of the apparatus as a whole, resulting in a reduced cost of manufacture of the apparatus.

According to the above arrangement, the developing and feeding mechanisms may comprise power transmission gear trains which are disengaged from a power transmission gear train of the drive device when the upper and lower sections are separated from each other.

A still further object of the present invention is to provide such an image recording apparatus as constructed according to the above-described arrangement, which is simple in construction, small in size and economical to manufacture.

The above object may be achieved according to an optional feature of the above arrangement, wherein the apparatus further comprises a presser plate for holding the active length of the recording medium in contact with an original which bears the original image, a plate drive mechanism for moving the presser plate between an operating position and a retracted position, and a light-source moving mechanism for moving an exposing light source of the developing device along the exposing path. The drive device operates as a common drive device for activating the plate drive mechanism and the light-source moving mechanism, as well as the developing and feeding mechanisms. According to this feature of the invention, all the four major mechanisms, i.e., developing mechanism, feeding mechanism, plate drive mechanism and light-source moving mechanism are driven by a single drive source or device. Thus, the apparatus can be simplified in construction, reduced in size and weight, and accordingly economical to manufacture. Further, the apparatus requires a reduced electric energy and operates with a reduced noise.

According to the above feature of the invention, the drive device may include an electrically operated motor, and a selective power transmitting device which is selectively placed in a first, a second and a third position thereof. In the first position, the selective power transmitting device transmits one of bidirectional rotating movements of the motor to the plate drive mechanism while inhibiting transmission of the one rotating movement to the developing mechanism, the feeding mechanism and the light-source moving mechanism. When the selective power transmitting device is placed in the second position, the other of the bidirectional rotating movements of the motor is transmitted to the developing and feeding mechanisms while the transmission of the other rotating movement to the plate drive and light-source moving mechanisms is inhibited. In the third position, the selective power transmitting device transmits the bidirectional movements of the motor to the light-source moving mechanism while inhibiting the bidirectional rotating movements to the developing, feeding and plate drive mechanisms.

The selective power transmitting mechanism may be adapted to comprise: a sun gear rotatable about a first axis and connected to the electrically operated motor; a planetary arm which is pivotable about the first axis; a planetary gear rotatably supported on the planetary arm and meshing with the sun gear; friction applying means disposed between the planetary gear and the planetary arm, for allowing rotation of the planetary gear while applying a frictional resistance to the planetary gear; a first and a second gear which are selectively brought into engagement with the planetary gear, by bidirectional pivotal movements of the planetary arm, respectively; a clutch arm supported pivotally about a second axis parallel to the first axis; a clutch gear supported on the clutch arm, and movable due to bidirectional pivotal movements of the clutch arm, between an operating position in which the clutch gear meshes with the sun gear, and a non-operating position in which the clutch gear is disengaged from the sun gear; a third gear rotatable about the second axis, and held in mesh with the clutch gear; and holding means disposed between the clutch arm and the planetary arm, for holding the planetary arm in a neutral position thereof in which the planetary gear is disengaged from the first and second gears, while the clutch gear and the sun gear mesh with each other. The plate drive mechanism is operatively connected to one of the first and second gears, while the developing and feeding mechanisms are operatively connected to the other of the first and second gears, and light-source moving mechanism are operatively connected to the third gear.

In accordance with an another aspect of the present invention, there is provided an image recording apparatus comprising: a medium supporting device for supporting an unused portion and a used portion of a pressure-sensitive photosensitive recording medium in the form of a web wound as a roll; an exposing device for imagewise exposing a portion of the photosensitive medium in an exposing path, to an image radiation representative of an original image to be reproduced; a developing mechanism for superposing an imagewise exposed portion of the photosensitive medium and a developer sheet on each other, and applying a pressure to the superposed portion of the medium and the developer sheet, to thereby develop a latent image on the imagewise exposed portion into a visible image on the developer sheet; a feeding mechanism for feeding the photosensitive medium along the exposing path, and feeding the developer sheet along a feed path; and a drive device for driving the developing and feeding mechanisms. The apparatus consists of two sections which are separable from each other at the exposing and feed paths.

In one form of the apparatus described above, the developing and feeding mechanisms are separated from the drive device upon separation of the two sections from each other, and are freely manually operable after the separation thereof from the drive device.

In accordance with a further aspect of the present invention, there is provided an image recording apparatus for recording an image on a pressure-sensitive photosensitive medium in the form of a web wound as a roll, comprising (a) an exposing device including an exposing light source for imagewise exposing a portion of the photosensitive recording medium in an exposing path to an image radiation, and a light-source moving mechanism for moving the exposing light source along the exposing path, (b) a feeding mechanism for feeding the photosensitive recording medium along the exposing path and winding a used portion of the recording medium, (c) a presser plate for holding the portion of the recording medium in the exposing path in contact with an original which bears the original image, and (d) a plate drive mechanism for moving the presser plate between an operating position and a retracted position, characterized in that: the light-source moving mechanism, the feeding mechanism and the plate drive mechanim are connected to a common drive source via a selective power transmitting mechanism, and are driven by the common drive source at different times in response to switching actions of the selective power transmitting mechanism.

BRIEF DESCRIPTION OF THE DRAWINGS

The above and optional objects, features and advantages of the present invention will become more apparent by reading the following detailed description of some presently preferred embodiments of the invention, when considered in connection with the accompanying drawings, in which.

DETAILED DESCRIPTION OF THE PREFERRED EMBODIMENTS

Figure 1:
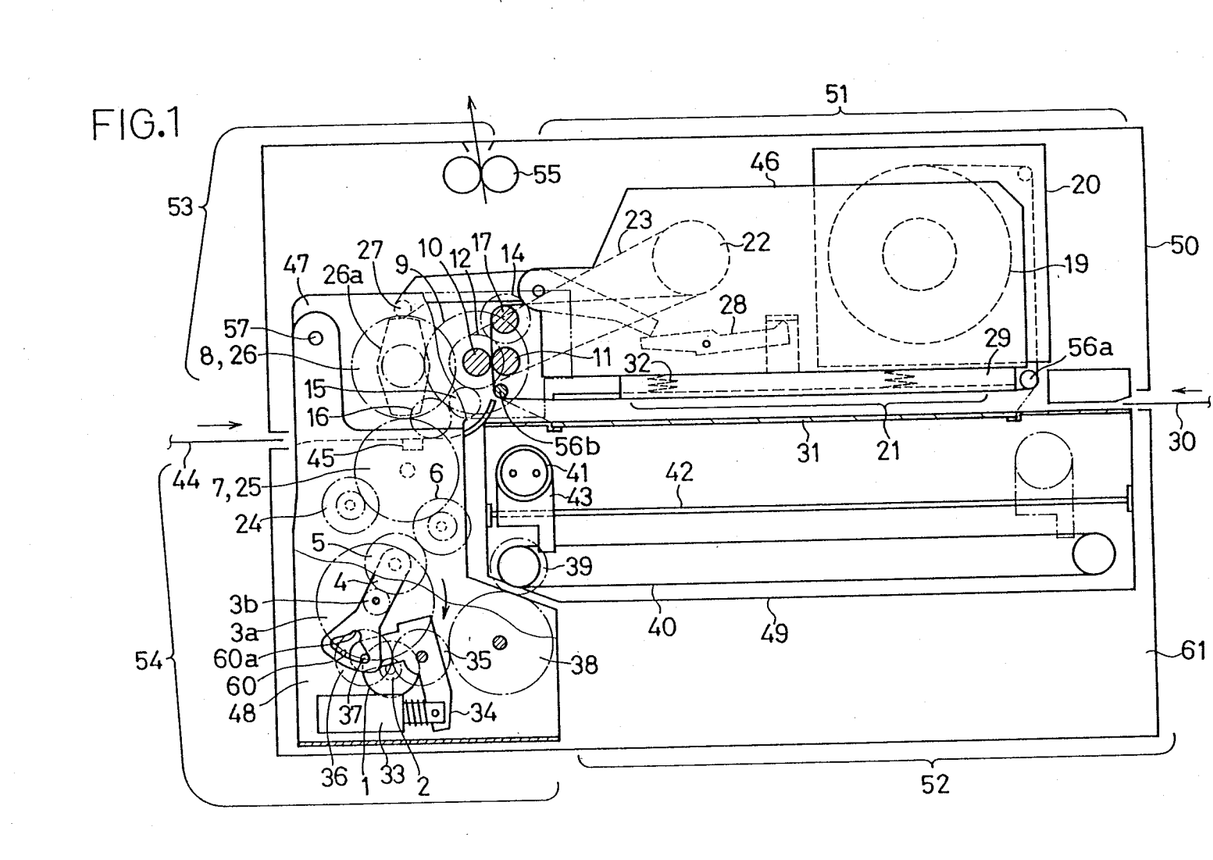
FIG. 1 is a schematic elevational view of one embodiment of an image recording apparatus of the present invention.
Figure 2:
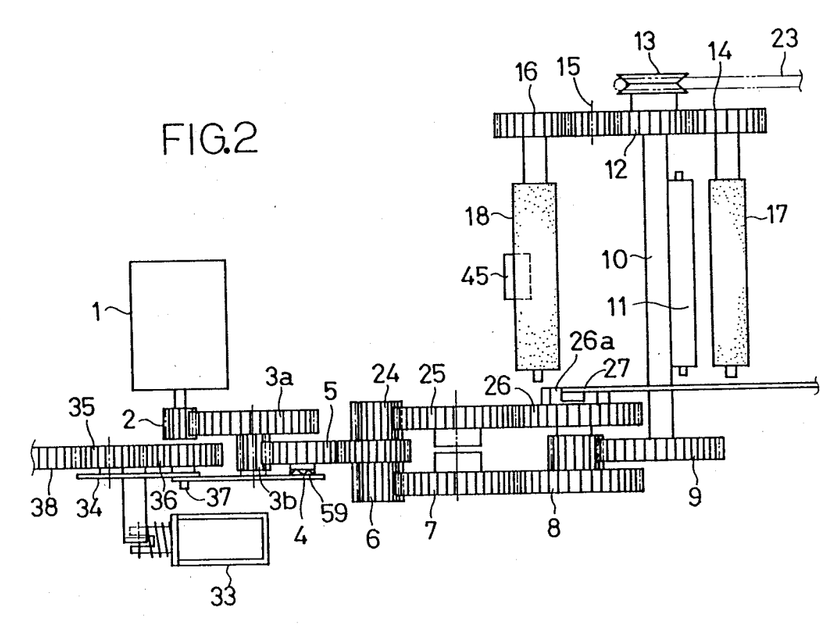
FIG. 2 is a fragmentary plan view of a mechanical arrangement of the recording apparatus of FIG. 1.

Referring first to the schematic elevational view of FIG. 1 and the plan view of FIG. 2, there is shown an image recording apparatus which consists of four portions which incorporate a medium supporting device 51, an exposing device 52, a developing device 53 and a drive device 54. Between the medium supporting device 51 and the exposing device 52, there is provided an exposing station indicated at 21 in FIG. 1. The exposing station defines an exposing path. An active portion or length of a pressure-sensitive photosensitive recording medium 19 in the form of a web is imagewise exposed to an image radiation while that portion of the web is located in the exposing station 21. More specifically, a transparent original 30 which bears an original image to be reproduced on the photosensitive web 19 is inserted from the right-hand side end of the apparatus (as seen in FIG. 1), such that the active length of the photosensitive web 19 is in slightly pressed contact with the original 30 at the exposing station 21. In this condition, the exposing device 52 located below the exposing station 21 is activated to irradiate the original 30, whereby the active length of the web 19 is imagewise exposed to the radiation which has passed the original 30. This radiation is the image radiation which represents the original image on the original 30. On the other hand, a developer sheet 44 is inserted into the apparatus from its left-hand side end (as seen in FIG. 1), through a feed path defined between the developing device 53 and the drive device 54. The developer sheet 44 is superposed on the imagewise exposed length of the photosensitive web 19, and the superposed developer sheet and web 44, 19 are fed into the developing device 53.

The medium supporting device 51 includes a first upper frame in the form of a medium support frame 46 which has a presser plate 29 for holding the active length of the photosensitive web 19 in pressed contact with the surface of the original 30. The medium support frame 46 is provided with springs 32 disposed between its lower part and the presser plate 29. The medium support frame 46 further has a clamp arm 27 pivotally supported thereon for moving the presser plate 29 in upward and downward directions between its lower operating and upper retracted position, via a relay arm 28. The medium support frame 46 further has a guide roll 56a and a take-up roll 22 rotatably supported thereon. The guide roll 56a guides the photosensitive web 19 toward the exposing station 21 (into the exposing path 21), and the used length of the photosensitive web 19 is wound on the take-up roll 22. A cassette 20 for accommodating a roll of the photosensitive web 19 is mounted on the medium support frame 46, such that the cassette 20 is readily removable for replacing the used cassette with a new one.

The exposing device 52 disposed below the medium supporting device 51 has a lower frame 49 which includes a light-transparent support plate 31 on which the original 30 is placed for exposure to a radiation from a lamp 41. The exposing device 52 further has: a lamp carriage 43 on which the lamp 41 is mounted; a guide shaft 42 which slidably supports the lamp carriage 43 so that the lamp 41 is reciprocated right and left (as seen in FIG. 1) together with the carriage 43; a wire belt 40 which is connected at a portion thereof to the lamp carriage 43; and a timing pulley 39 for rotating the wire belt 40 to reciprocate the lamp carriage 43. The timing pulley 39 receives a rotating motion from a gear 38 of the drive device 54.

The developing device, 53 is disposed to the left of the medium supporting device 51 and has an upper frame in the form of a roller support frame 47. This frame 47 is secured at its right-hand side end to the medium support frame 46 of the medium supporting device 51, so that the two frames 46, 47 cooperate with each other to form a single upper frame unit. The roller support frame 47 is connected to a lower frame 48 of the drive device 54, pivotally about a hinge shaft 57. In this arrangement, the upper frame unit 46, 47 is pivotable upwardly about the hinge shaft 57, from a lower closed position of FIG. 1 to an upper open position. The roller support frame 47 rotatably supports: a pair of presser rolls 10, 11 which define a pressure nip therebetween; a guide roll 56b for guiding the photosensitive web 19 from the exposing station or path 21 toward the pressure nip of the presser rolls 10, 11; a feed roll 17 for feeding the developed length of the web 19 toward the take-up roll 22; and a sheet feed roll 18 for feeding the developer sheet 44 toward the pressure nip of the presser rolls 10, 11.

Referring to FIG. 2, the presser roll 10 has a roll gear 9 fixed at its one end, and a feed gear 12 and a take-up pulley 13 which are secured to the other end. The presser roll 10 is connected to the feed roll 17 through gear 14 which meshes with the feed gear 12, and to the sheet feed roll 18 through a gear 15 meshing with the gear 12, and a gear 16 meshing with the gear 15. Further, the roll support frame 47 has a cam gear 26 rotatably supported thereon. This cam gear 26 has a peripheral cam 26a formed on one of its opposite sides, so that one end of the clamp arm 27 is held in rolling contact with the outer surface of the peripheral cam 26a. The take-up pulley 13 and the take-up roll 22 are connected to each other by a friction belt 23, so that a rotary motion of the presser roll 10 is imparted to the take-up roll 22, whereby the used length of the photosensitive web 19 which has passed through the pressure nip of the presser rolls 10, 11 is wound on the take-up roll 22.

The frame 48 of the drive device 54 is a comparatively massive structure on which are supported a motor 1 having a pinion 2 on its output shaft, first reduction gears 3a, 3b, and a planetary arm 4 which is coaxial with the gears 3a, 3b and which is pivotable about an axis of rotation of the gears 3a, 3b. The planetary arm 4 has a planetary gear 5 mounted rotatably at its one end via a friction spring 59. The planetary gear 5 is movable due to the friction force of the spring 59, along an arc of a circle having a center on the axis of the gear 3b, when the planetary arm 4 is pivoted about the gear 3b. The frame 48 further has a gear 6 which meshes with the planetary gear 5 when the planetary arm 4 is pivoted in the clockwise direction (as seen in FIG. 1) with a clockwise rotation of the gear 3b as a result of an operation of the motor 1 in the forward direction. The frame 48 also has a gear 24 which meshes with the planetary gear 5 when the planetary arm 4 is pivoted in the counterclockwise direction with a counterclockwise rotation of the gear 3b, as a result of an operation of the motor 1 in the reverse direction. A rotary motion of the gear 6 is imparted to the roll gear 9 via gears 7 and 8, while a rotary motion of the gear 24 is imparted to the cam gear 26 via a gear 25.

The frame 48 of the drive device 54 further has: a gear 38 which meshes with the timing pulley 39 of the exposing device 52; a gear 35 which meshes with the gear 38; a clutch arm 34 pivotally supported by a shaft of the gear 35; and a clutch solenoid 33 connected to one end of the clutch arm 34, for pivoting the clutch arm 34 about the shaft of the gear 35. The clutch arm 34 has a clutch gear 36 rotatably supported at its other end. With the clutch arm 34 pivoted, the clutch gear 36 is moved along an arc of a circle having a center on the axis of the shaft of the gear 35. In this arrangement, the clutch arm 34 is pivoted in the clockwise direction (as seen in FIG. 1) upon energization of the clutch solenoid 33, and the clutch gear 36 is brought into engagement with the gear 3b, whereby a rotary motion of the gear 3b is transmitted to the timing pulley 39 via the clutch gear 36 and gears 35, 38. The clutch arm 34 has a clutch pin 37 formed so as to extend coaxially with the shaft of the clutch gear 36. The clutch pin 37 is received within an opening 60 formed in an end portion of the planetary arm 4 which is remote from the planetary gear 5. Upon energization of the clutch solenoid 33, the clutch pin 37 is brought into engagement with an engaging portion 60a of the opening 60, so that the planetary arm 4 is held in its neutral position in which the planetary gear 5 is disengaged from both of the gears 6 and 24. In this neutral position, therefore, a rotary motion of the motor 1 is imparted only to the timing pulley 39 of the exposing device 52.

The developing device 53 has a pair of heater rolls 55 for fixing a visible image reproduced on the developer sheet 44 delivered from the presser rolls 10, 11. The developer sheet 44 which has passed the nip of the heater rolls 55 is ejected out of the instant image recording apparatus. The entire structure of the apparatus is accommodated within an upper cover 50 and a lower cover 61.

Figure 4:
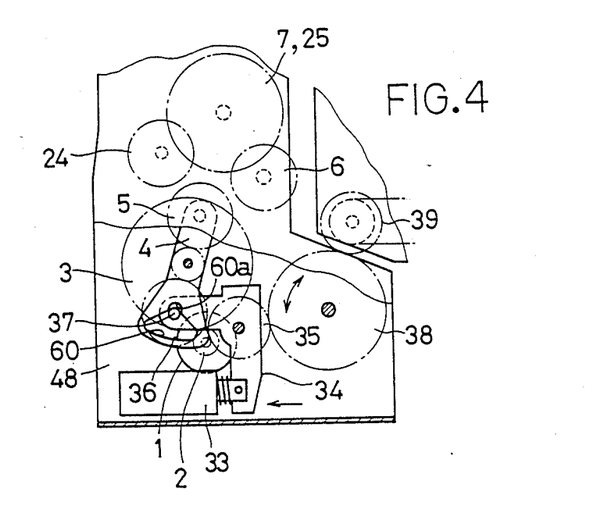
FIG. 4 is a fragmentary elevational view showing a further operating position of the drive device for moving a lamp of an exposing device of the apparatus.

An image recording operation on the instant apparatus constructed as described above will be described. While the apparatus is at rest, the cam gear 26 is placed such that the cam follower at the end of the clamp arm 27 is held by the peripheral cam 26a, in its uppermost position, whereby the presser pate 29 is held in its upper retracted position, against the downward biasing action of the springs 32, as indicated in FIG. 1. In this position, the exposing station 21 is open, allowing the original 30 to be inserted under the presser plate 29. On the other hand, the lamp 41 of the exposing device 52 is positioned at the left-hand side end of the device 52, as indicated in FIG. 1. Further, the clutch solenoid 33 is held off, and the planetary arm 4 is placed in its neutral position as indicated in FIG. 4. In this condition, the original 30 is inserted through an inlet at the right-hand side end of the apparatus, such that the original 30 is placed on the light-transparent support plate 31. Then, the developer sheet 44 is inserted through an inlet at the left-hand side end of the apparatus. The insertion of the developer sheet 44 is sensed by a paper sensor 45, which generates a signal to initiate an image recording cycle.

Figure 3A:
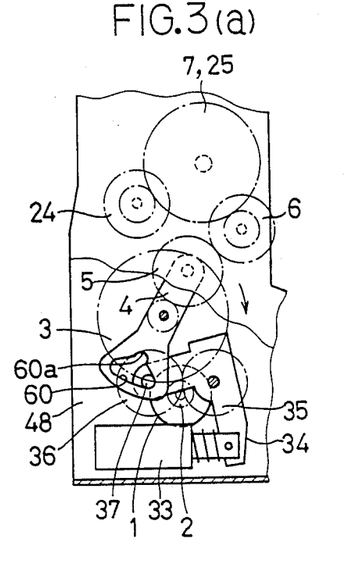
FIGS. 3(a) and 3(b) are fragmentary elevational views showing different operating positions of a drive device of the apparatus.

Initially, the motor 1 is operated in the counterclockwise direction, whereby the gears 3a, 3b engaging the pinion 2 are rotated in the clockwise direction. As a result, the planetary arm 4 is pivoted in the clockwise direction under the biasing action of the friction spring 59, whereby the planetary gear 5 is brought into engagement with the gear 6, as indicated in FIG. 3(a). Accordingly, a rotary motion of the motor 1 is transmitted to the presser roll 10, via the gears 7, 8 and the roll gear 9. Simultaneously, the sheet feed roll 18 is rotated through the feed gear 12 and the gears 15, 16, while the feed roll 17 is rotated through the gear 14. Consequently, the developer sheet 44 and the photosensitive web 19 are fed to predetermined positions, along the feed path between the developing and drive devices 53, 54, and along the exposing path (21) between the medium supporting device 51 and the exposing device 52, respectively.

Figure 3B:
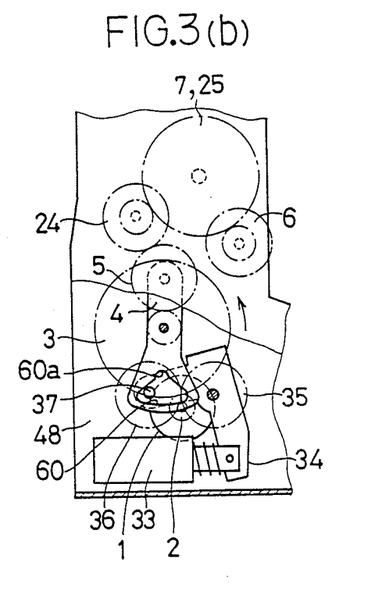

Successively, the motor 1 is operated in the reverse direction, i.e., in the clockwise direction, and the planetary arm 4 is pivoted in the counterclockwise direction, whereby the planetary gear 5 is brought into engagement with the gear 24, as indicated in FIG. 3(b). As a result, a rotary motion of the motor 1 is transmitted to the cam gear 26 through the gear 25, and the peripheral cam 26a is rotated. The motor 1 is turned off when the cam follower of the clamp arm 27 engaging the cam 26a is moved to its lowermost position, which is detected by a rotary position sensor (not shown) provided on the cam gear 26. Consequently, the relay arm 28 is pivoted in the clockwise direction, permitting the presser plate 29 to be moved downward to its operating position, under the downward biasing action of the springs 32. Thus, the active portion of the photosensitive web 19 and the original 30 are forced against the support plate 31, with the active portion of the web 19 held in slightly pressed contact with the surface of the original 30.

In the next step, the clutch solenoid 33 is energized so as to pivot the clutch arm 34 in the clockwise direction, whereby the clutch gear 36 on the arm 34 is brought into engagement with the gear 3b, as indicated in FIG. 4. Concurrently, the clutch pin 37 is moved in the opening 60 and brought into engagement with the engaging portion 60a. Thus, the planetary arm 4 is placed in its neutral position of FIG. 4 in which the planetary gear 5 is disengaged from both of the gears 6 and 24. Accordingly, a rotary motion of the motor 1 is imparted to the timing pulley 39 of the exposing device 52, via the gear 3b, clutch gear 36 and gears 35, 38, irrespective of the operating direction of the motor 1. Namely, the bidirectional operations of the motor 1 cause the wire belt 40 to be rotated in the bidirectional directions via the timing pulley 39, whereby the lamp carriage 43 and the lamp 41 mounted thereon are reciprocated right and left, along the exposing station or path 21, while the lamp 41 is held on. During this reciprocation of the lamp 41, a radiation generated by the lamp 41 is transmitted through the light-transparent support plate 31 and incident upon the original 30, whereby the active portion or length of the photosensitive web 19 is imagewise exposed to an image radiation which has passed through the original 30. The image radiation represents an original image formed on the original 30.

After the completion of an exposing step of the recording cycle, clutch solenoid 33 is deenergized, and the clutch arm 34 is pivoted in the counterclockwise direction, so that the clutch gear 36 and the clutch pin 37 are disengaged from the gear 3b and engaging portion 60a, respectively. Subsequently, the motor 1 is again activated in the clockwise direction, whereby the planetary gear 5 comes into mesh with the gear 24, with a result of rotating the cam gear 26 so as to raise the presser plate 29 against the biasing action of the springs 32, via the clamp and relay arms 27, 28, as indicated in FIG. 3b. In consequence, the imagewise exposed portion of the photosensitive web 19 is released from the original 30. The motor 1 is turned off when the presser plate 29 reaches its upper retracted position, that is, when the cam follower at the end of the clamp arm 27 is raised to its uppermost position by the peripheral cam 26a of the cam gear 26.

Subsequently, the motor 1 is operated in the counterclockwise direction, to bring the planetary gear 5 into mesh with the gear 6, whereby the presser roll 10 is rotated to feed the pressure-sensitive photosensitive web 19 and the developer sheet 44, such that the developer sheet 44 is superposed on the imagewise exposed portion of the web 19 before they reach the pressure nip of the presser rolls 10, 11. Accordingly, the latent image formed on the imagewise exposed portion of the web 19 is developed into a visible image on the developer sheet 44, under a developing pressure exerted on the exposed portion of the web 19 by the presser rolls 10, 11. The used length of the web 19 leaving the presser rolls 10, 11 is fed by the feed roll 17 and wound on the take-up roll 22. In the meantime, the developer sheet 44 is separated from the used length of the web 19 and is passed between the heater rolls 55, whereby the visible image formed on the sheet 44 is fixed under heat generated by the heater rolls 55. The developer sheet 44 leaving the heater rolls 55 is ejected out of the image recording apparatus.

Figure 5:
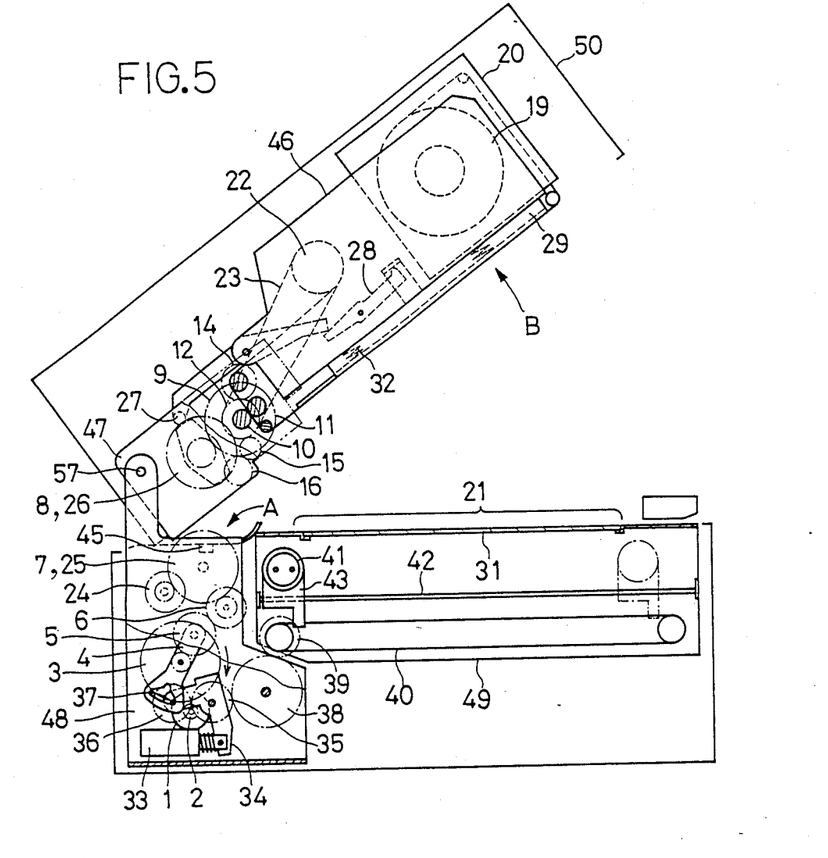
FIG. 5 is an elevational view showing an open position of an upper section of the apparatus.

When the photosensitive web 19 is initially threaded through the apparatus, or in the event that the web 19 or developer sheet 44 is jammed part way through the exposing or feed path, the upper section of the apparatus including the medium supporting device 51 and the developing device 53 is pivoted about the hinge shaft 57, in the counterclockwise or upward direction, with the upper section being lift by hand at the right-hand side end of the upper cover 50. Namely, the upper section of the apparatus is separated from the lower section, at the feed path "A" and the exposing path "B" (21) formed through the apparatus, as indicated in FIG. 5. As a result, the gears 25 and 7 supported on the lower frame 48 of the drive device 54 are disengaged from the mating gears 26 and 8 supported on the upper roll frame 47 of the developing device 53, respectively. In this condition, the mechanism of the developing device 53 is made free from the mechanism of the drive device 54. In other words, the presser roll 10 and other members of the developing device 53 can be freely or easily rotated by hand.

With the upper section of the apparatus in the open position of FIG. 5, the feed path "A" defined above the drive device 54 and the exposing path "B" defined below the presser plate 29 of the medium supporting device 51 are made accessible, so that the jamming trouble of the photosensitive web 19 or developer sheet 44 can be readily eliminated. Further, upon installation of a new roll of the photosensitive web 19, the leading length of the web 19 can be easily threaded along the exposing path "B" (exposing station 21), into the developing device 53.

The upper section of the apparatus can be restored to the normal closed position of FIG. 1, by pivoting the upper section in the clockwise direction about the hinge shaft 57, so that the right-hand side end of the upper cover 51 is brought into an aligned close relation with the right-hand side end of the lower cover 61. By this pivotal movement of the upper section of the apparatus, the gears 25 and 7 are engaged with the corresponding gears 26 and 8, so that the developing and feeding mechanisms incorporated in the developing device 53 are driven by the drive device 54.

While the illustrated embodiment described above is adapted such that the upper section of the apparatus is separated from the lower section by a pivotal movement of the upper section with respect to the lower section, it is possible that the upper section is separated from the lower section by temporarily removing the upper section from the lower section. In this case, provisions are made for suitably positioning and locking the upper section with respect to the lower section.

Figure 6:
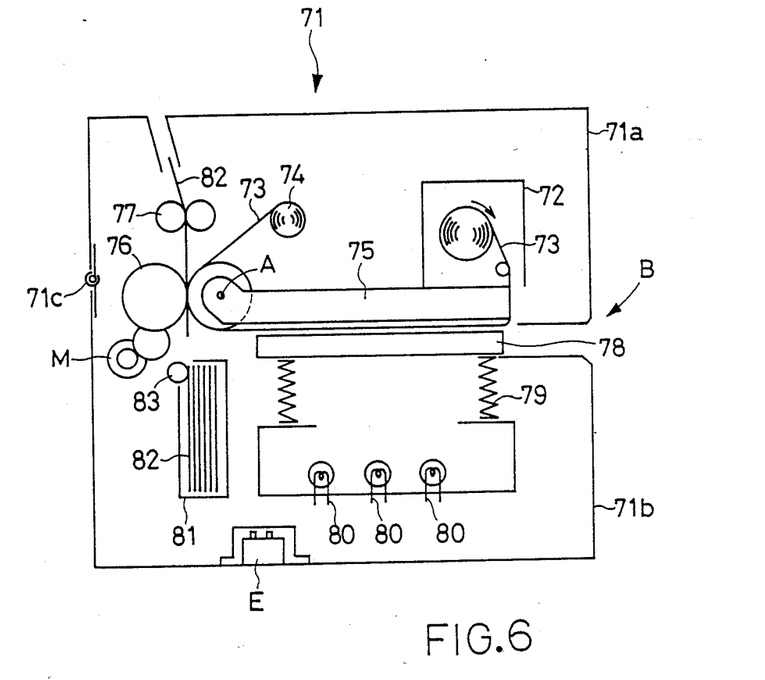
FIG. 6 is a schematic elevational view showing another embodiment of the image recording apparatus of the invention.

Referring next to FIG. 6, there is illustrated another embodiment of the image recording apparatus of the present invention, generally indicated at 71. The apparatus 71 has a lower portion which incorporates an exposing device including a light source device 80. Above the light source device 80, there is disposed an original holder device 78 in which is placed a transparent original (not shown) bearing an original image to be reproduced. Above the original holder device 78, there is provided a medium supporting device 75. Between the light source device 80 and the original holder device 78, there is interposed a spring 79 for biasing the holder device 78 toward the medium supporting device 75. To the left of the medium supporting device 75 is provided a developing device which includes a pair of presser rolls 76 and a pair of heater rolls 77. The presser rolls 76 are rotatably supported within a lower cover 71b of the apparatus 71, such that the medium supporting device 75 is supported at its left-hand side end (as seen in FIG. 6), pivotally about a rotating axis "A" of the right presser roll 76. Thus, the medium supporting device 75 is pivotable with respect to the original holder device 78 and the lower cover 71b, between its closed and open positions. The heater rolls 77 are rotatably supported on an upper cover 71a which covers the medium supporting device 75.

On a right-hand side portion of the medium supporting device 75, there is mounted a medium cassette 72 in which is accommodated a roll of a photosensitive recording medium in the form of a color imaging pressure-sensitive photosensitive web 73 as disclosed in U.S. Pat. No. 4,399,209. However, other types of photosensitive recording medium may be used without a modification of the exposing device, but with an appropriate minor modification of the developing device. The medium supporting device 75 has a take-up roll 74 rotatably supported thereon at a position to the left of the medium cassette 72. The take-up roll 74 is adapted to take up the used length of the photosensitive web 73.

At a position within the lower cover 71b right below the presser rolls 76 of the developing device, there is disposed a sheet cassette 81 which accommodates a stack of developer sheets 82. The sheet cassette 81 is provided at its upper end with a feed roller 83 for delivering the developer sheets 82 one at a time from the cassette. The entire assembly of the apparatus 71 is enclosed by the upper and lower covers 71a, 71b, such that the upper cover 71a is connected to the lower cover 71b, pivotally about a hinge portion 71c at the left-hand side end of the apparatus 71. A motor M to drive the presser rolls 76, and an electric power source E for the exposing device 80 and other electrically operated members are accommodated within the lower cover 71b. Thus, the lower section of the image recording apparatus 71 which is enclosed by the lower cover 71b incorporates the light source device 80, sheet cassette 81, motor M and power source E, and therefore acts as a considerably heavy base for pivotally supporting the upper section within the upper cover 71a.

An image recording operation on the instant image recording apparatus 71 will be described.

Initially, an original transparency (not shown) having a desired original image is set in the original holder device 78. The device 78 is held by the spring 79 in pressed contact with the active portion of the pressure-sensitive photosensitive web 73 which extends along an exposing path defined between the holder device 78 and the medium supporting device 75. A light source of the exposing device 80 is activated to imagewise expose the active portion of the photosensitive web 73 to an image radiation, through the original in the original holder device 78, whereby a latent image corresponding to the original image on the original is formed on the imagewise exposed portion of the web 73.

After the completion of the exposing operation, the take-up roll 74 is rotated to advance the imagewise exposed portion of the web 73 into the developing device. At the same time, the feed roller 83 is activated to deliver the developer sheet 82 from the sheet cassette 81 toward the presser rolls 76, so that the developer sheet 82 is superposed on the exposed portion of the web 73. With further advancing movements of the developer sheet 82 and the photosensitive web 73, the superposed portion of the web 73 and developer sheet 82 are passed through the pressure nip of the presser rolls 76, whereby the latent image on the exposed portion of the web 73 is developed into a visible color image on the developer sheet 82. The developer sheet 82 is then separated from the photosensitive web 73, and the used length of the web 73 is wound on the take-up roll 74, while the developer sheet 82 is passed through the nip of the heater rolls 77, for fixing the color image. Then, the developer sheet 82 is discharged out of the image recording apparatus 71.

There will then be described a procedure for replacing the used roll of the photosensitive web 73 with a new one.

Figure 7A:
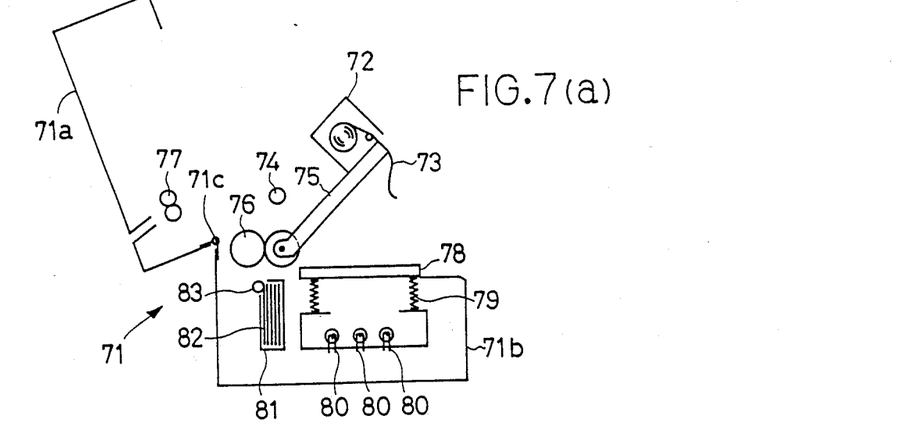
FIGS. 7(a), 7(b) and 7(c), and FIG. 8 are explanatory views illustrating steps of threading a photosensitive web through the apparatus.
Figures 7B, 7C:
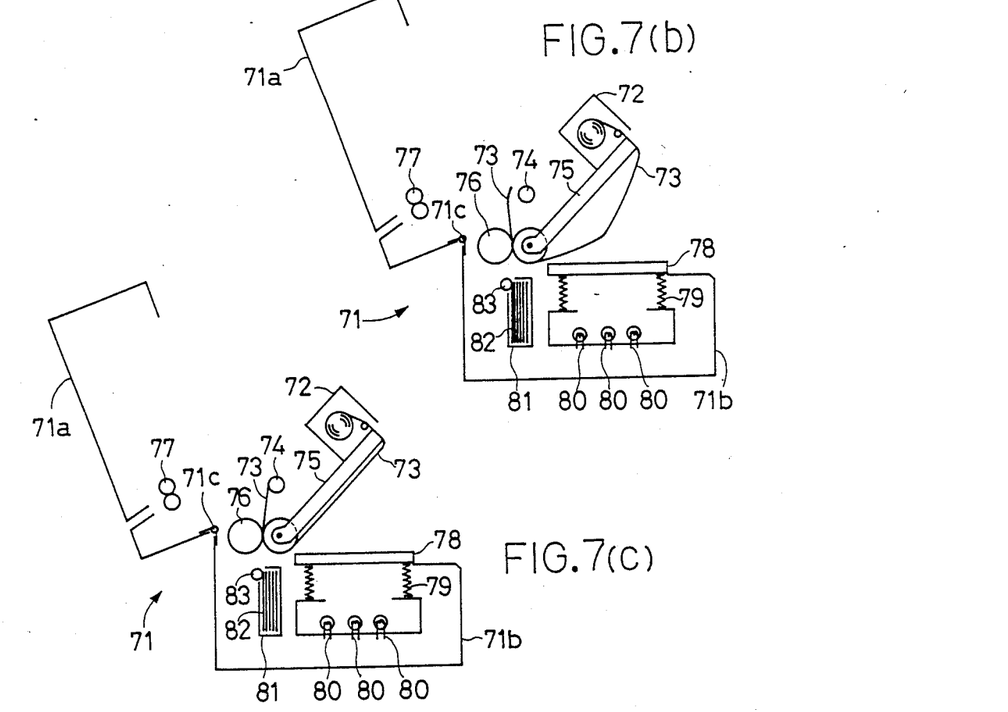
Figure 8:
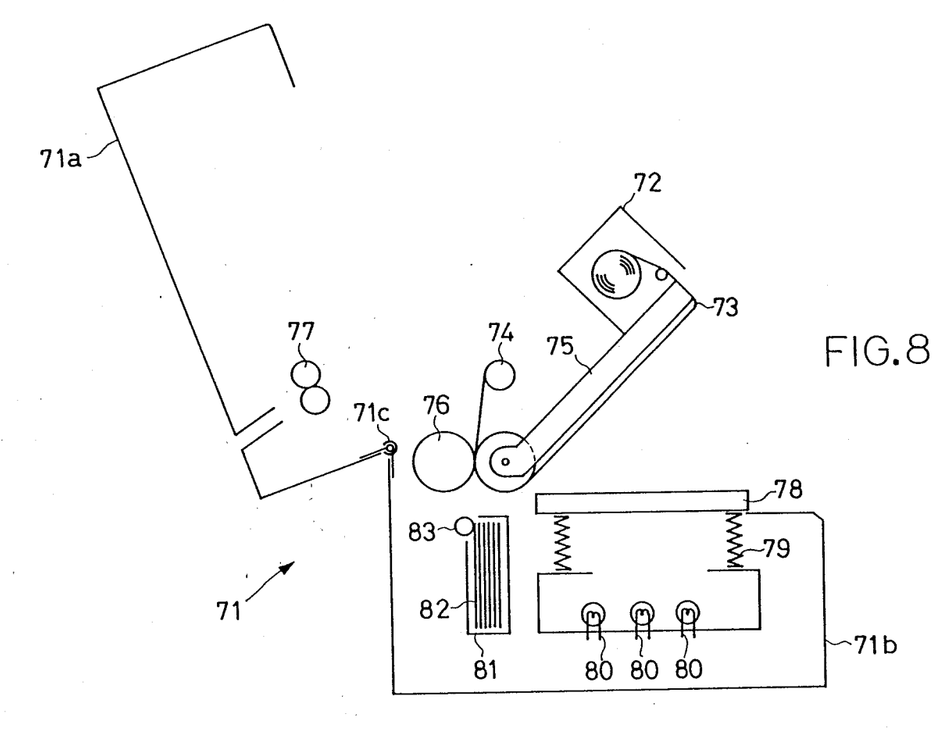

Initially, the upper cover 71a is pivoted from the closed position of FIG. 6, in the counterclockwise direction about the hinge portion 71c, with an operator's hand holding the cover at its right-hand side end B. Then, the medium supporting device 75 is pivoted in the counterclockwise direction about the rotating axis A of the right-hand side presser roll 76. Thus, the upper cover 71a and the medium supporting device 75 are placed in the open position, as indicated in FIG. 8. In this condition, the cassette 72 and the take-up roll 74 are removed, and new cassette and take-up roll are set in position. Then, the leading portion of the photosensitive web 73 exposed externally of the cassette 72 as indicated in FIG. 7(a) is pulled out and passed along the bottom surface of the medium supporting device 75, until the leading end of the web 73 reaches the nip of the presser rolls 76, from under the rolls 76. Subsequently, the presser rolls 76 are rotated so as to advance the leading portion of the web 73 through the pressure nip of the rolls 76, by a suitable distance, as indicated in FIG. 7(b). Then, a suitable leading length of the photosensitive web 73 is wound on the take-up roll 74, as indicated in FIG. 7(c). Then, the medium supporting device 75 and the upper cover 71a are pivoted in the clockwise direction, back to the original closed position, in the order of description. The device 75 and the upper cover 71a are suitably locked in position.

In the present image recording apparatus 71, the medium supporting device 75 for supporting the cassette 73, and the upper cover 71a covering the device 75, can be easily pivoted to the open position pivotally about the respective axes on the side of the developing device, in the same direction and independently of each other. In the open position, there exist substantially no components which disturb the operator in threading the leading end of the photosensitive web 73 through the developing device. In particular, the pivoting of the medium supporting device 75 about the rotating axis A of the right-hand side presser roll 76 facilitates the passing of the leading end of the web 73 through the pressure nip of the presser rolls 76, since the right-hand side presser roll 76 may serve as a guide for directing the web 73 toward the nip of the rolls 76.

While the pressure-sensitive photosensitive web 73 is used in the above embodiment, the image recording apparatus 71 may be adapted to use other types of photosensitive recording medium. Further, a reciprocating or scanning type exposing device as illustrated in FIG. 1 may be used, rather than the stationary exposing device 80 of the instant embodiment which is adapted to expose the entire area of the predetermined portion of the web 73 while the web is also stationary.

Figure 9:
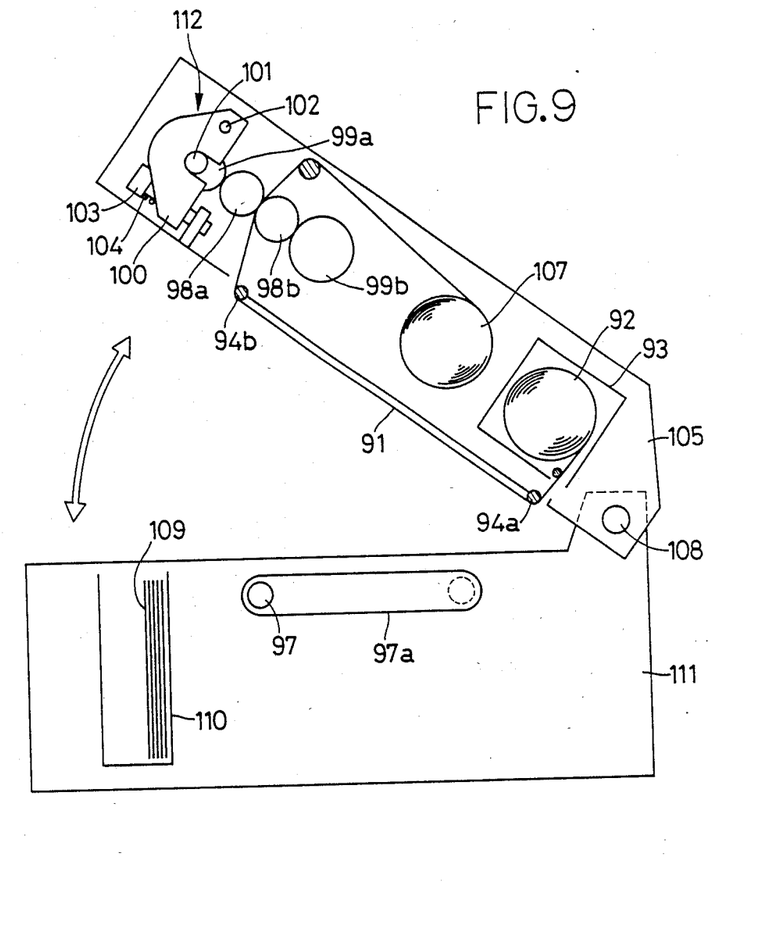
FIG. 9 is a schematic elevational view showing a further embodiment of the image recording apparatus of the present invention, when its upper section is placed in its open position.
Figure 10:
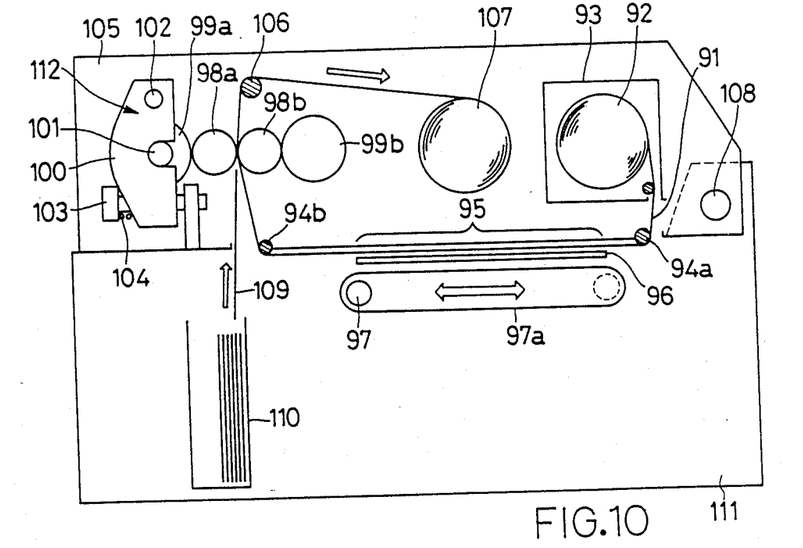
FIG. 10 is a view showing the apparatus of FIG. 9, when the upper cover is placed in its normal closed position.

Referring further to FIGS. 9 and 10, a further embodiment of the image recording apparatus of the invention will be described. The apparatus includes a base frame 111, and an upper frame 105 which is pivotally connected to the base frame 111, by a hinge shaft 108 provided at one end of the base frame 111, so that the upper frame 105 is pivotable about the hinge shaft 108 between its normal closed position of FIG. 10 and the upper open position of FIG. 9. The upper frame 105 is adapted to receive a medium cassette 93 mounted thereon. The cassette 93 accommodates a roll 92 on which a pressure-sensitive photosensitive web 91 is wound. The photosensitive web 91 supplied from the cassette 93 is threaded through the apparatus, more precisely, along a horizontal exposing path or station 95 between two guide rolls 94a, 94b rotatably supported on the upper frame 105, through a pressure nip between a pair of presser rolls 98a, 98b of a developing device 112, via a separator roll 106, up to a take-up roll 107.

The upper frame 105 also supports the developing device 112, separator roll 106 and take-up roll 107. Below the exposing station 95, a suitable support is provided to support an original 96 which bears a desired original image to be reproduced. The base frame 111 incorporates an exposing device which includes a reciprocating fluorescent lamp 97 movably supported by an endless belt 97a. This belt 97a extends below and along the original 96, and is rotated by a suitable drive mechanism so that the fluorescent lamp 97 secured to the belt 97a is reciprocated parallel to the original 96. The presser rolls 98a, 98b are forced against each other by respective back-up rolls 99a, 99b. The back-up roll 99a is supported by a pre-load shaft 101 which is supported by a pair of pre-load levers 100. The pre-load levers 100 are supported at an upper end portion thereof by a shaft 102, pivotally about an axis of the shaft 102. A pre-load adjusting screw 103 engages a lower end portion of the pre-load levers 100 via a pre-load spring 104, so that a controlled pre-loading pressure is applied to the presser roll 98a via the back-up roll 99a. The base frame 111 is adapted to receive a sheet cassette 110 which accommodates a stack of developer sheets 109. These developer sheets 109 are delivered from the cassette 110 one at a time, toward the pressure nip of the presser rolls 98a, 98b.

An operation of the instant image recording device will be described by reference to FIGS. 9 and 10.

Initially, the appropriate portion of the photosensitive web 91 is set on the exposing station 95 (so as to extend along the exposing path 95), and the original 96 is placed right below the exposing station 95. A start switch (not shown) is then operated to energize the fluorescent lamp 97 and move the energized lamp 97 by rotating the belt 97a. As a result, the active portion of the web 91 on the exposing station 95 is imagewise exposed to a radiation generated by the lamp 97, through the original 96, whereby a latent image corresponding to the original image on the original 96 is formed on the exposed portion of the web 91. Then, the web 91 and the developer sheet 109 are fed so that they are superposed on each other and passed through the pressure nip of the presser rolls 98a, 98b. As a result, a visible image corresponding to the latent image on the web 91 is formed on the developer sheet 109. The used length of the photosensitive web 91 is separated by the separator roll 106 from the developer sheet 109 and directed to the take-up roll 107.

In the event the developer sheet 109 is jammed prior to the nip of the presser rolls 98a, 98b, the upper frame 105 is upwardly pivoted away from the base frame 111 about the hinge shaft 108, as indicated in FIG. 9, whereby the feed path of the developer sheet 109 is accessible for removal of the jammed sheet.

While the instant apparatus does not include heater or fixing rolls for fixing a visible image reproduced on the developer sheet 109 or for lustering the imaged surface thereof, the apparatus may include such fixing rolls as provided in the preceding embodiments.

In all of the three illustrated embodiments, the photosensitive recording medium 19, 73, 91 is imagewise exposed to an image radiation which is transmitted through an original located adjacent to the recording medium. However, the original may be located a considerably large distance away from the recording medium. In this case, suitable optical means is used to focus the original image on the surface of the medium. Further, the recording medium may be exposed to an image radiation which is reflected by the original when the original is irradiated by a light source device.

Although the illustrated embodiments are adapted such that the upper frame, or the medium supporting device and upper cover, is/are pivotable with respect to the lower or base frame, other types of movement of these members are possible for separating the upper and lower sections of the apparatus from each other, so that the exposing path for the photosensitive web and/or the feed path for the developer sheet is/are accessible for removal of the jammed web or sheet, or for threading of the photosensitive web through the apparatus. For instance, the developing device or other parts of the apparatus may be made accessible by slidably moving the relevant part or parts of the apparatus with respect to the lower or base frame or section.

While the present invention has been described in its presently preferred embodiments with a cetain degree of particularity, it is to be understood that the invention is not limited to the details of the illustrated embodiments and the above-described modifications thereof, but may be embodied with various other changes, modifications and improvements, which may occur to those skilled in the art, without departing from the spirit and scope of the invention defined in the following claims.

What is claimed is:

1. An image recording apparatus comprising:
   a medium supporting device for supporting a supply roll of a photosensitive recording medium in the form of a web, such that an active length of said web supplied from said supply roll extends along an exposing path;
   an exposing device for imagewise exposing said active length of said web of the photosensitive recording medium to an image radiation representative of an original image to be reproduced, while said active length is placed in said exposing path;
   a take-up roll for taking up the imagewise exposed active length of said web;
   an upper section which is disposed above said exposing path and which supports said medium supporting device, and said take-up roll;
   a lower section which is disposed below said exposing path and which has said exposing device; and
   separating means for separating said upper and lower sections from each other at said exposing path.

2. An image recording apparatus according to claim 3, wherein said upper and lower sections include as a main body an upper frame and a lower frame, respectively, and said upper frame is attached to said lower frame pivotally about an axis, said upper and lower sections being separable from each other at said exposing path, by a pivotal movement of said upper frame with respect to said lower frame.

3. An image recording apparatus according to claim 2, wherein said exposing device operates to form a latent image corresponding to said original image on said active length of said recording medium, by imagewise exposing said active length to said image radiation, and said lower section includes a pair of developing rolls which defines a pressure nip therebetween, said imagewise exposed length of said medium having said latent image being passed through said pressure nip, whereby said latent image is developed into a visible image, said upper frame being supported pivotally about an axis of rotation of one of said pair of developing rolls.

4. An image recording apparatus according to claim 2, further comprising an upper cover which covers said medium supporting device, said upper cover being attached to said lower section such that said upper cover is pivotable relative to said upper frame in a direction away from said lower section, independently of said upper frame.

5. An image recording apparatus according to claim 1, wherein said exposing device operates to form a latent image corresponding to said original image, on said active length of said recording medium, by imagewise exposing said active length to said image radiation, said apparatus further comprising a developing device for developing said latent image into a visible image, said upper frame supporting said developing device.

6. An image recording apparatus according to claim 1, further comprising:
a developing mechanism having developing rolls for pressing the imagewise exposed active length of said recording medium and a developer sheet superposed on said exposed active length toward each other, to thereby develop a latent image on said exposed active length into a visible image on said developer sheet; and
a feeding mechanism for feeding said active length of said recording medium along said exposing path, and said developer sheet along a feed path, said upper and lower sections being separable from each other at said exposing and feed paths.

7. An image recording apparatus comprising:
a medium supporting device for supporting a roll of a photosensitive recording medium in the form of a web, such that an active length of said web supplied from said roll extends along an exposing path;
an exposing length for imagewise exposing said active length of said web of the photosensitive recording medium to an image radiation representative of an original image to be reproduced, while said active length is placed in said exposing path;
a developing mechanism having developing rolls for pressing the imagewise exposed active length of said recording medium and a developer sheet superposed on said exposed active length toward each other, to thereby develop a latent image on said exposed active length into a visible image on said developer sheet;
a feeding mechanism for feeding said active length of said recording medium along said exposing path, and said developer sheet along a feed path;
an upper section which is disposed above said exposing and feed paths which has said medium supporting device;
a lower section which is disposed below said exposing and feed paths and which has said exposing device; and
separating means for separating said upper and lwoer sections from each other at said exposing and feed paths.

8. An image recording apparatus according to claim 7, wherein said lower section includes a drive device for driving said developing mechanism and said feeding mechanism, said developing and feeding mechanisms being operatively disconnected from said drive device when said upper and lower sections are separated from each other, and being freely manually operable after said developing and feeding mechanisms are disconnected from the drive device.

9. An image recording apparatus according to claim 8, wherein said developing and feeding mechanisms comprise power transmission gear trains which are disengaged from a power transmission gear train of said drive device when said upper and lower sections are separated from each other.

10. An image recording apparatus according to claim 8, further comprising:
a presser plate for holding said active length of said recording medium in contact with an original which bears said original image;
a plate drive mechanism for moving said presser plate between an operating position and a retracted position; and
a light-source moving mechanism for moving an exposing light source of said exposing device along said exposing path, said drive device operating as a common drive device for activating said plate drive mechanism and said light-source moving mechanism.

11. An image recording apparatus according to claim 10, wherein said drive device includes an electrically operated motor, and a selective power transmitting device which is selectively placed in a first position thereof for transmitting one of bidirectional rotating movements of said motor to said plate drive mechanism while inhibiting transmission of said one rotating movement to said developing mechanism, said feeding mechanism and said light-source moving mechanism, a second position thereof for transmitting the other of said bidirectional rotating movements of said motor to said developing and feeding mechanisms while inhibiting transmission of said other rotating movement to said plate drive and light-source moving mechanisms, or a third position thereof for transmitting said bidirectional movements of said motor to said light-source moving mechanism while inhibiting said bidirectional rotating movements to said developing, feeding and plate drive mechanisms.

12. An image recording apparatus according to claim 11, wherein said selective power transmitting mechanism comprises:
a sun gear rotatable about a first axis and connected to said electrically operated motor;
a planetary arm which is pivotable about said first axis;
a planetary gear rotatably supported on said planetary arm and meshing with said sun gear;
friction applying means disposed between said planetary gear and said planetary arm, for allowing rotation of said planetary gear while applying a frictional resistance to said planetary gear;
a first and a second gear which are selectively brought into engagement with said planetary gear, by bidirectional pivotal movements of said planetary arm, respectively;
a clutch arm supported pivotally about a second axis parallel to said first axis;
a clutch gear supported on said clutch arm, and movable due to bidirectional pivotal movements of said clutch arm, between an operating position in which said clutch gear meshes with said sun gear, and a non-operating position in which said clutch gear is disengaged from said sun gear;
a third gear rotatable about said second axis, and held in mesh with said clutch gear; and
holding means disposed between said clutch arm and said planetary arm, for holding said planetary arm in a neutral position thereof in which said planetary gear is disengaged from said first and second gears, while said clutch gear and said sun gear mesh with each other, said plate drive mechanism being operatively connected to one of said first and second gears, while said developing and feeding mechanisms being operatively connected to the other of said first and second gears, and light-source moving mechanism being operatively connected to said third gear.

13. An image recording apparatus comprising:
a medium supporting device for supporting an unused portion and a used portion of a pressure-sensitive photosensitive recording medium in the form of a web wound as a roll;
an exposing device for imagewise exposing a portion of said photosensitive medium in an exposing path, to an image radiation representative of an original image to be reproduced;
a developing mechanism for superposing an imagewise exposed portion of said photosensitive medium and a developer sheet on each other, and applying a pressure to the superposed portion of said medium and said developer sheet, to thereby develop a latent image on said imagewise exposed portion into a visible image on said developer sheet;
a feeding mechanism for feeding said photosensitive medium along said exposing path, and feeding said developer sheet along a feed path; and
a drive device for driving said developing and feeding mechanisms,
and wherein said apparatus consists of two sections which are separable from each other at said exposing and feed paths.

14. An image recording apparatus according to claim 13, wherein said developing and feeding mechanisms are separated from said drive device upon separation of said two sections from each other, and are freely manually operable after the separation thereof from said drive device.

15. An image recording apparatus for recording an image on a pressure-sensitive photosensitive medium in the for of a web wound as a roll, comprising:
an exposing device including an exposing light source for imagewise exposing a portion of said photosensitive recording medium in an exposing path to an image radiation, and a light-source moving mechanism for moving said exposing light source along said exposing path;
a feeding mechanism for feeding said photosensitive recording medium along said exposing path and winding a used portion of said recording medium;
a presser plate for holding said portion of the recording medium in said exposing path in contact with an original which bears said original image; and a plate driven mechanism for moving said presser plate between an operating position and a retracted position,
said light-source moving mechanism, said feeding mechanism and said plate drive mechanism being connected to a common drive source via a selective power transmitting mechanism, and driven by said common drive source at different times in response to switching actions of said selective power transmitting mechanism.

16. An image recording apparatus comprising:
a medium supporting device for supporting a roll of a photosensitive recording medium in the form of a web, such that an active length of said web supplied from said roll extends along an exposing path;
an exposing device for imagewise exposing said active length of said web of the photosensitive recording medium to an image radiation representative of an original image to be reproduced, to form a latent image corresponding to said original image on said active length, while said active length is placed in said exposing path;
a pair of developing rolls defining therebetween a pressure nip through which said imagewise exposed length of said medium having said latent image is passed to develop said latent image into a visible image;
an upper section which is disposed above said exposing path and which has an upper frame supporting said medium supporting device;
a lower section which is disposed below said exposing and which has a lower frame supporting said exposing device and said pair of developing rolls; and
said upper frame being supported pivotally about an axis of rotation of one of said pair of developing rolls so that said upper and lower sections are separable from each other at said exposed path, by a pivotal movement of said upper frame about said axis of rotation.

17. An image recording apparatus comprising:
a medium supporting device for supporting a roll of a photosensitive recording medium in the form of a web, such that an active length of said web supplied from said roll extends along an exposing path;
an exposing device for imagewise exposing said active length of said web of the photosensitive recording medium to an image radiation representative of an original image to be reproduced, while said active length is placed in said exposing path;
an upper section while is disposed above said exposing path and which has an upper frame supporting said medium exposing device;
a lower section which is disposed below said exposing path and which has a lower frame supporting said exposing device;
said upper frame being attached to said lower frame pivotally about an axis, said upper and lower sections being separable from each other at said exposing path, by a pivotal movement of said upper frame with respect to said lower frame; and
an upper cover which covers said medium supporting device, said upper cover being attached to said lower section such that said upper cover is pivotable relative to said upper frame in a direction away from said lower section, independently of said upper frame.

18. An image recording apparatus comprising:
a medium supporting device for supporting a roll of a photosensitive recording medium in the form of a web, such that an active length of said web supplied from said roll extends along an exposing path;
a exposing device for imagewise exposing said active length of said web of the photosensitive recording medium to an image radiation representative of an original image to be reproduced, to form a latent image corresponding to said original image on said active length, while said active length is placed in said exposing path;
a developing device for developing said latent image into a visible image;
an upper section which is disposed above said exposing path and which supports said medium supporting device, and said developing device;
a lower section which is disposed below said exposing path and which has said exposing device; and
separating means for separating said upper and lower sections from each other at said exposing path.

* * * * *